United States Patent [19]
Branstad et al.

[11] Patent Number: 5,764,712
[45] Date of Patent: Jun. 9, 1998

[54] PHASE LOCKED LOOP CIRCUIT HAVING AUTOMATIC RANGE SETTING LOGIC

[75] Inventors: Mark William Branstad; Philip Lynn Leichty; Brian Andrew Schuelke, all of Rochester, Minn.

[73] Assignee: International Business Machines Corporation, Armonk, N.Y.

[21] Appl. No.: 634,504

[22] Filed: Apr. 18, 1996

[51] Int. Cl.⁶ ........................................... H03L 7/10
[52] U.S. Cl. .................. 375/376; 331/1 A; 331/DIG. 2; 327/159; 327/160; 327/163
[58] Field of Search .................... 375/371, 373, 375/376; 331/1 A, 1 R, 11, 14, 44, 172, 175, DIG. 2; 327/156, 159, 160, 161, 162, 163

[56] References Cited

U.S. PATENT DOCUMENTS

| | | |
|---|---|---|
| 3,989,931 | 11/1976 | Phillips. |
| 4,593,254 | 6/1986 | Coburn. |
| 4,876,518 | 10/1989 | Perkins. |
| 5,015,970 | 5/1991 | Williams et al.. |
| 5,168,245 | 12/1992 | Koskowich. |
| 5,311,149 | 5/1994 | Wagner et al.. |
| 5,331,292 | 7/1994 | Worden et al. ........................ 331/1 A |
| 5,355,092 | 10/1994 | Kosaka et al.. |
| 5,359,727 | 10/1994 | Kurita et al. ........................... 395/550 |
| 5,394,444 | 2/1995 | Silvey et al.. |
| 5,422,911 | 6/1995 | Barrett, Jr. et al.. |
| 5,619,484 | 4/1997 | Yokota et al. ........................... 369/50 |

*Primary Examiner*—Don N. Vo
*Assistant Examiner*—Amanda T. Le
*Attorney, Agent, or Firm*—Joan Pennington

[57] ABSTRACT

A method for setting a locking frequency operating range of the phase locked loop (PLL) circuit and a phase locked loop (PLL) circuit are provided with range select logic for detecting an unknown reference clock frequency and for setting a locking frequency operating range of the phase locked loop. First a bypass mode for the phase locked loop (PLL) circuit is set. An unknown reference clock frequency is applied to a first counter. A known oscillator clock frequency is applied to a second counter. The first and second counters are reset and a timeout value of the second counter is identified. A first counter count value is compared with precalculated constant values. A set of range bits are latched responsive to said compared values. Two consecutive sets of latched range bits are compared and the steps repeated until a match of two consecutive sets of latched range bits is identified. The matching latched range bits are applied to a programmable range select input of the phase locked loop (PLL) circuit.

11 Claims, 2 Drawing Sheets

5,764,712

PHASE LOCKED LOOP CIRCUIT HAVING AUTOMATIC RANGE SETTING LOGIC

FIELD OF THE INVENTION

The present invention relates to a phase locked loop (PLL) circuit, and more particularly to, a method for setting a locking frequency operating range of the phase locked loop (PLL) circuit and a phase locked loop (PLL) circuit including logic for detecting an unknown reference clock frequency and for setting a locking frequency operating range of the phase locked loop.

DESCRIPTION OF THE PRIOR ART

Use of phase locked loop (PLL) circuits is increasing with increasing system clock speeds and faster bus speeds. A locking frequency operating range of a PLL circuit is set by programmable input pins known as range select bits. Often times, the range select bits are set manually with jumpers wires or dip switch settings on a circuit card. If the range select bits cannot be changed, the frequency range of the PLL circuit is limited; thus limiting the potential applications of the PLL circuit. Some applications, such as the peripheral component interconnect (PCI) bus, require a greater range than allowed by one range setting of a PLL circuit. For example, popular frequencies of the PLL circuit are 25 MHz and 33 MHz. Two different range settings are required for a PLL circuit to operate at both 25 MHz and 33 MHz frequencies. Typically two different card part numbers for the PLL circuits are required to provide both frequencies, 25 MHz and 33 MHz. The required inventory and overhead for the two different range settings increases expense and complexity.

Another problem of conventional PLL circuit arrangements is that frequency changes in the reference clock can require a new locking frequency operating range for proper operation of the PLL circuit.

SUMMARY OF THE INVENTION

Important objects of the present invention are to provide a method for setting a locking frequency operating range of the phase locked loop (PLL) circuit and a phase locked loop (PLL) circuit with logic for detecting an unknown reference clock frequency and for setting a locking frequency operating range of the phase locked loop; to provide such method for setting a locking frequency operating range of the phase locked loop (PLL) circuit and PLL circuit logic substantially without negative effect; and to provide such method and PLL circuit logic for setting a locking frequency operating range of the phase locked loop that overcomes many of the disadvantages of prior art PLL circuit arrangements.

In brief, a method for setting a locking frequency operating range of the phase locked loop (PLL) circuit and a phase locked loop (PLL) circuit are provided with range select logic for detecting an unknown reference clock frequency and for setting a locking frequency operating range of the phase locked loop. First a bypass mode for the phase locked loop (PLL) circuit is set. An unknown reference clock frequency is applied to a first counter. A known oscillator clock frequency is applied to a second counter. The first and second counters are reset and a timeout value of the second counter is identified. A first counter count value is compared with precalculated constant values. A set of range bits are latched responsive to said compared values. Two consecutive sets of latched range bits are compared and the steps repeated until a match of two consecutive sets of latched range bits is identified. The matching latched range bits are applied to a programmable range select input of the phase locked loop (PLL) circuit.

BRIEF DESCRIPTION OF THE DRAWINGS

The present invention together with the above and other objects and advantages may best be understood from the following detailed description of the preferred embodiments of the invention illustrated in the drawings, wherein.

BRIEF DESCRIPTION OF THE PREFERRED EMBODIMENTS

Figure 1:
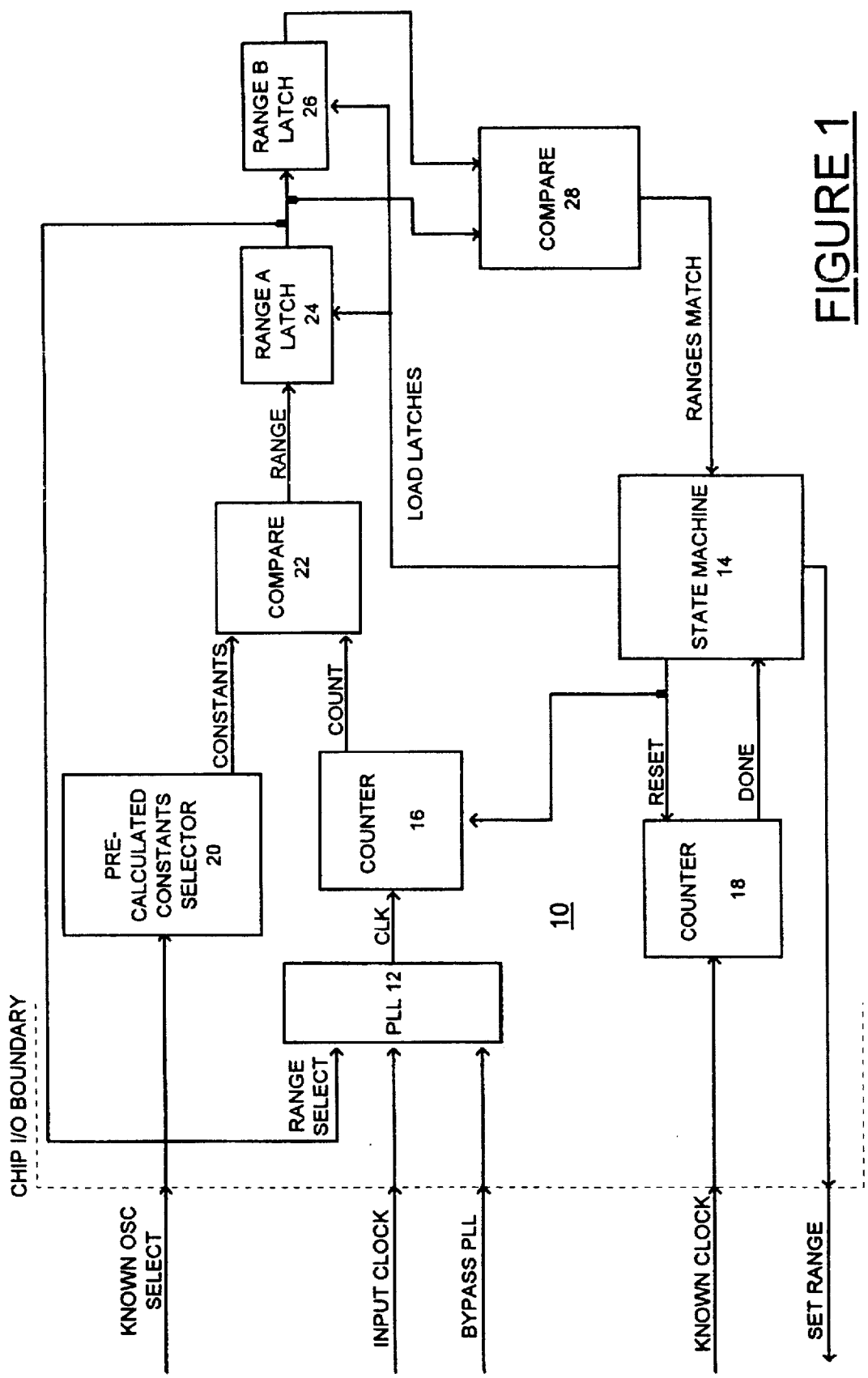
FIG. 1 is schematic and block diagram representation of a phase locked loop (PLL) circuit including range setting logic for detecting an unknown reference clock frequency and for setting a locking frequency operating range of the phase locked-loop to lock on correctly in accordance with the present invention.

Having reference now to the drawings, in FIG. 1, there is shown a range setting logic generally designated by the reference character 10 and arranged in accordance with the present invention used with a phase locked loop (PLL) circuit 12. In accordance with an important feature of the present invention, an unknown clock frequency is sampled relative to a known oscillator frequency to set a programmable range select input or range select bits of the phase locked loop (PLL) circuit 12. Range setting logic 10 automatically detects the unknown reference clock frequency and sets a locking frequency operating range of the phase locked loop (PLL) circuit 12. The range setting logic 10 dynamically changes range select bits of the phase locked loop (PLL) circuit 12 with reference clock changes.

Range setting logic 10 includes a state machine 14 arranged for automatic operation to detect an unknown reference clock frequency and set the locking frequency operating range. At power on or reset time, the range setting logic 10 is enabled and the PLL is set to the BYPASS mode indicated at a line labeled BYPASS PLL. When the reference input clock applied to the PLL circuit 12 changes the PLL circuit 12 will become unlocked. This causes the range setting circuit 10 to begin an automatic range setting operational mode. A first counter 16 is coupled to the PLL 12 for receiving an unknown reference clock frequency indicated at a line labeled CLK.

Range setting logic 10 includes a second counter 18 for receiving a known oscillator clock frequency indicated at a line labeled KNOWN CLOCK. The state machine 14 provides a reset signal indicated at a line labeled RESET to start the first and second counters 16 and 18. When the second counter 18 counts to a set counter value, a control signal is applied to the state machine 14 indicated at a line labeled DONE.

Range setting logic 10 includes a precalculated constants selector 20 for receiving a known oscillator select signal and providing precalculated constant values to a comparator 22. The precalculated constant values are based on the known oscillator clock frequency that is applied to the second counter 18. Comparator 22 compares the first counter count value and precalculated constant values and provides range select bits as indicated at a line labeled RANGE. The set of range bits determined by the comparison of range constants are sequentially latched by a first range A latch 24 and a second range B latch 26. State machine 14 applies a control signal to the first range A latch 24 and second range B latch 26 as indicated at a line labeled LOAD LATCHES.

A comparator 28 connected to latches 24 and 26 compares consecutive sets of range bits latched by the first range A latch 24 and second range B latch 26 to identify a match as indicated at a line labeled RANGES MATCH. The latched range bits are fed into a programmable range select input of the PLL 12 indicated at a line labeled RANGE SELECT. After two consecutive sets of range bits match, the PLL 12 is then taken out of BYPASS mode and normal operation resumes.

Figure 2:
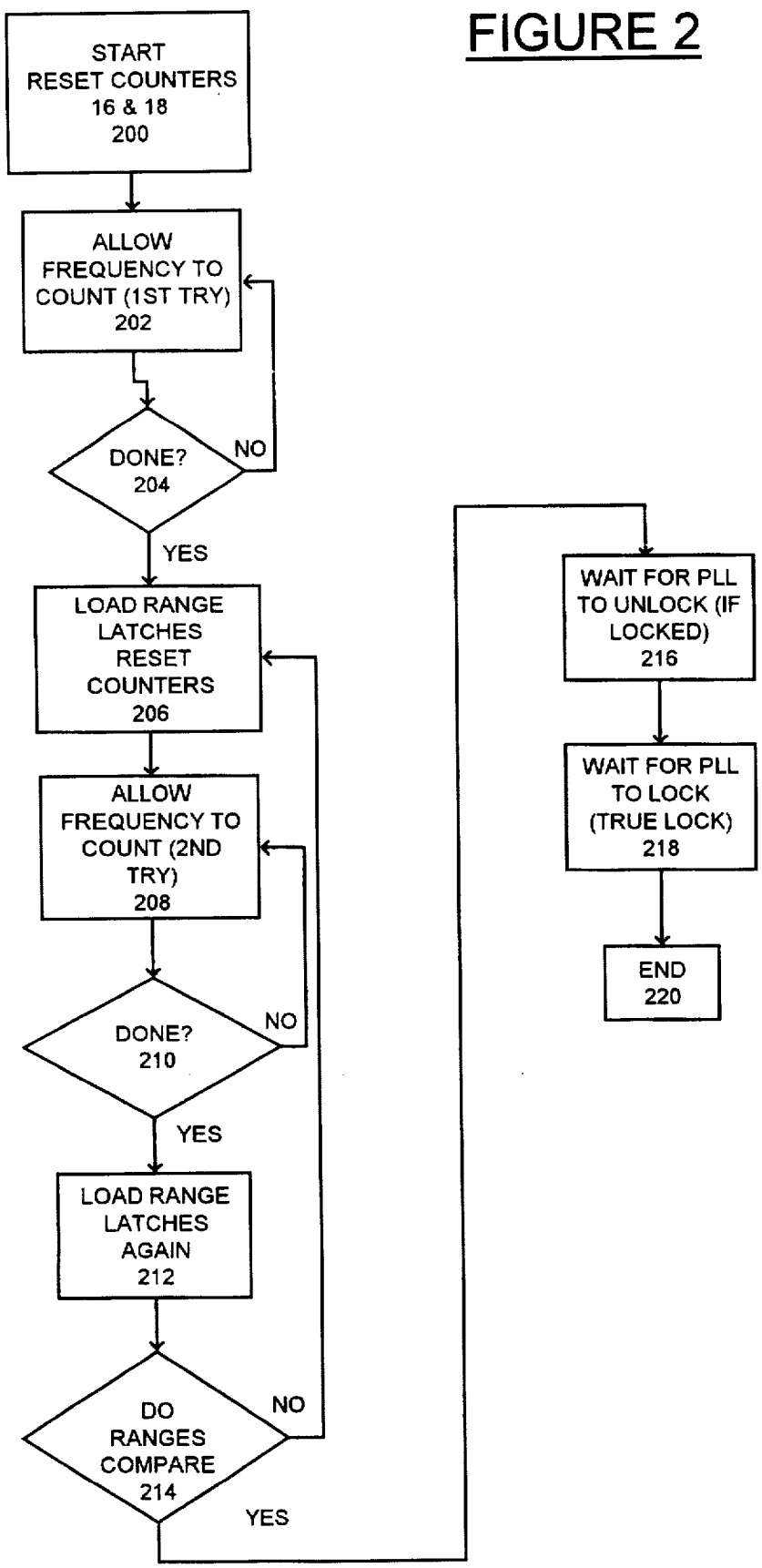
FIG. 2 is a logical flow diagram illustrating the operation of a state machine of the phase locked loop (PLL) range setting logic in accordance with the present invention.

Referring also to FIG. 2, sequential operations of the state machine 14 of the range setting logic 10 are illustrated. Automatic range setting operations start with resetting the counters 16 and 18 as indicated at a block 200. The known oscillator clock is applied to counter 18 as indicated at a block 202 labeled ALLOW FREQUENCY TO COUNT (1ST TRY). The state machine 14 waits for a timeout signal supplied by counter 18 as indicated at a decision block 204 labeled DONE? Then the range latches 24 and 26 are loaded and the counters 16 and 18 are reset as indicated at a block 206 labeled LOAD RANGE LATCHES RESET COUNTERS. With the known oscillator clock applied to counter 18 as indicated at a block 208 labeled ALLOW FREQUENCY TO COUNT (2ND TRY), the state machine 14 waits for a timeout signal supplied by counter 18 as indicated at a decision block 210 labeled DONE? Then the range latches 24 and 26 are loaded again at a block 212 and the ranges are compared as indicated a decision block 214 labeled DO RANGES COMPARE. If two consecutive sets of latched range bits of range latches 24 and 26 do not match, then the sequential operations return to block 206 and are repeated. Otherwise, when matching consecutive sets of latched range bits of range latches 24 and 26 are identified at block 214 by the RANGES MATCH signal applied by comparator 28 to the state machine 14, the latched range bits are applied to the PLL 12. The PLL 12 is allowed to unlock, if locked, as indicated at a block 216. Then the PLL is allowed to lock as indicated at a block 218 labeled WAIT FOR PLL TO LOCK (TRUE LOCK). The PLL circuit 12 is reset from the BYPASS mode and normal operation is resumed. The automatic range setting function is completed as indicated at a block 220 labeled END.

While the present invention has been described with reference to the details of the embodiments of the invention shown in the drawing, these details are not intended to limit the scope of the invention as claimed in the appended claims.

What is claimed is:

1. A phase locked loop (PLL) circuit comprising:
means for detecting an unknown reference clock frequency; said means for detecting said unknown reference clock frequency including means for setting a bypass mode for the phase locked loop (PLL) circuit, and first counter means for receiving said unknown reference clock frequency; and
means responsive to said unknown reference clock frequency detecting means for setting a locking frequency operating range of the phase locked loop (PLL) circuit.

2. A phase locked loop (PLL) circuit as recited in claim 1 wherein said means responsive to said unknown reference clock frequency detecting means for setting said locking frequency operating range of the phase locked loop (PLL) circuit include a state machine operatively controlling said unknown reference clock frequency detecting means.

3. A phase locked loop (PLL) circuit as recited in claim 1 wherein said means for detecting said unknown reference clock frequency include means for storing precalculated constant values.

4. A phase locked loop (PLL) circuit as recited in claim 3 wherein said means for detecting said unknown reference clock frequency include means for comparing said precalculated constant values with a count value from said unknown reference clock frequency receiving first counter means.

5. A phase locked loop (PLL) circuit as recited in claim 4 wherein said means for detecting said unknown reference clock frequency include latch means responsive to said comparing means for latching a set of range bits.

6. A phase locked loop (PLL) circuit as recited in claim 5 wherein said means responsive to said unknown reference clock frequency detecting means for setting said locking frequency operating range of the phase locked loop (PLL) circuit include second counter means for receiving a known oscillator clock frequency.

7. A phase locked loop (PLL) circuit as recited in claim 6 wherein said means responsive to said unknown reference clock frequency detecting means for setting said locking frequency operating range of the phase locked loop (PLL) circuit include a state machine, said state machine being coupled to said second counter means for identifying a timeout value and state machine being coupled to said latch means for loading said range latch means.

8. A phase locked loop (PLL) circuit as recited in claim 7 wherein said state machine is coupled to said first counter means and said second counter means for resetting said counters.

9. A phase locked loop (PLL) circuit as recited in claim 8 wherein said latch means include a first latch and a second latch for latching two consecutive sets of said range bits; and further includes range bit comparing means coupled to said first and second latches for comparing said latched sets of said range bits to identify a match of two consecutive sets of said latched range bits and wherein said state machine is coupled to said range bit comparing means and said state machine being responsive to said identified matching sets of range bits for setting said locking frequency operating range of the phase locked loop (PLL) circuit.

10. A method for setting a locking frequency operating range of a phase locked loop (PLL) circuit using an automatic range selecting state machine comprising the steps of:
setting a bypass mode for the phase locked loop (PLL) circuit;
applying an unknown reference clock frequency to a first counter;
applying a known oscillator clock frequency to a second counter;
resetting said first and second counters and identifying a timeout value of said second counter;
comparing a first counter count value with precalculated constant values;
latching a set of range bits responsive to said compare values;
comparing two consecutive sets of latched range bits;
repeating the above steps until a match of two consecutive sets of latched range bits is identified; and
providing said matching latched range bits into a programmable range select input of the phase locked loop (PLL) circuit.

11. A method for setting a locking frequency operating range of a phase locked loop (PLL) circuit as recited in claim 10 further includes the step of ending said bypass mode and resetting the phase locked loop (PLL) circuit to a normal operating mode responsive to providing said matching latched range bits into said programmable range select input.

* * * * *